# United States Patent
Hsu

(10) Patent No.: US 7,839,650 B2
(45) Date of Patent: Nov. 23, 2010

(54) CIRCUIT BOARD STRUCTURE HAVING EMBEDDED CAPACITOR AND FABRICATION METHOD THEREOF

(75) Inventor: Shih-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 636 days.

(21) Appl. No.: 11/977,780

(22) Filed: Oct. 25, 2007

(65) Prior Publication Data

US 2008/0264677 A1 Oct. 30, 2008

(30) Foreign Application Priority Data

Oct. 25, 2006 (TW) .............................. 95139297 A

(51) Int. Cl.
*H05K 1/18* (2006.01)

(52) U.S. Cl. ...................... 361/761; 361/762; 361/763; 361/764; 174/260

(58) Field of Classification Search ......... 361/761–764; 174/260
See application file for complete search history.

(56) References Cited

U.S. PATENT DOCUMENTS

| 5,422,513 | A | 6/1995 | Marcinkiewicz et al. |
| 5,670,262 | A | 9/1997 | Dalman |
| 5,683,928 | A | 11/1997 | Wojnarowski et al. |
| 5,694,030 | A | 12/1997 | Sato et al. |
| 5,696,031 | A | 12/1997 | Wark |
| 5,905,639 | A | 5/1999 | Warren |
| 6,055,151 | A | 4/2000 | Tormey et al. |
| 6,144,479 | A | 11/2000 | Lugg et al. |
| 6,320,757 | B1 | 11/2001 | Liu |
| 6,432,497 | B2 | 8/2002 | Bunyan |
| 6,706,564 | B2 | 3/2004 | Kim et al. |
| 6,784,765 | B2 | 8/2004 | Yamada et al. |
| 6,952,049 | B1 | 10/2005 | Ogawa et al. |
| 6,972,964 | B2 | 12/2005 | Ho et al. |
| 6,984,453 | B2 | 1/2006 | Sugimoto et al. |
| 7,071,024 | B2 | 7/2006 | Towle et al. |
| 7,080,446 | B2 | 7/2006 | Baba et al. |
| 7,129,571 | B2 | 10/2006 | Kang |
| 7,198,996 | B2 | 4/2007 | Nakatani et al. |
| 7,304,248 | B2 * | 12/2007 | Tada et al. ................... 174/260 |
| 7,307,852 | B2 | 12/2007 | Inagaki et al. |
| 7,361,573 | B2 | 4/2008 | Takayama et al. |
| 7,613,007 | B2 * | 11/2009 | Amey et al. .................. 361/763 |
| RE41,051 | E * | 12/2009 | Asai et al. .................... 361/794 |
| 2003/0102572 | A1 | 6/2003 | Nathan et al. |

(Continued)

*Primary Examiner*—Tuan T Dinh
*Assistant Examiner*—Andargie M Aychillhum
(74) *Attorney, Agent, or Firm*—Morrison & Foerster LLP

(57) ABSTRACT

The present invention provides a circuit board structure having an embedded capacitor and a method for fabricating the same. The circuit board structure includes a core layer board with at least one surface having non-penetrating first and second grooves, a circuit layer and a first electrode plate formed in the first and second grooves of the core layer board respectively and being flush with the core layer board; a high dielectric material layer formed on the core layer board, the circuit layer and the first electrode plate; a second electrode plate formed on the high dielectric material layer and corresponding to the first electrode plate, thereby forming a capacitor by the first and second electrode plates and the high dielectric material layer. The high dielectric material layer is formed on a plane surface so as to eliminate poor filling and improve reliability.

16 Claims, 8 Drawing Sheets

U.S. PATENT DOCUMENTS

| | | |
|---|---|---|
| 2003/0122244 A1 | 7/2003 | Lin et al. |
| 2003/0197285 A1 | 10/2003 | Strandberg et al. |
| 2004/0150966 A1 | 8/2004 | Hu |
| 2004/0178510 A1 | 9/2004 | Sunohara et al. |
| 2005/0230797 A1 | 10/2005 | Ho et al. |
| 2005/0270748 A1 | 12/2005 | Hsu |
| 2006/0060959 A1 | 3/2006 | Hayashi et al. |
| 2007/0034865 A1 | 2/2007 | Yukawa |
| 2008/0023821 A1 | 1/2008 | Hsu |
| 2008/0024998 A1 | 1/2008 | Hsu |

* cited by examiner

CIRCUIT BOARD STRUCTURE HAVING EMBEDDED CAPACITOR AND FABRICATION METHOD THEREOF

BACKGROUND OF THE INVENTION

1. Field of the Invention

The present invention relates to a circuit board structure having an embedded capacitor and a method for fabricating the same, and more particularly, to a circuit board structure integrated with a capacitor and a circuit structure and a method for fabricating the same.

2. Description of the Prior Art

As electronic products are becoming smaller, it is the trend that electronic components are embedded in package substrates to accommodate such a trend. For example, passive elements such as resistors, capacitors and inductors are often embedded in a substrate. A wiring structure is then provided on the substrate to form a circuit board structure with embedded passive components for electrically connecting to active elements such as semiconductor chips.

FIGS. 1A to 1C are cross-sectional views illustrating the conventional method for fabricating a circuit board structure with an embedded capacitor.

Referring to FIG. 1A, a circuit layer 10 and a first electrode plate 11a are disposed on each of the two opposing surfaces of the core layer board 1. At least one plated through hole (PTH) 12 penetrating the core layer board 1 is formed for electrically connecting the circuit layers 10.

Referring to FIG. 1B, a high dielectric material layer 13 is formed on the surface of the core layer board 1, the circuit layers 10 and the first electrode plates 11a.

Referring to FIG. 1C, a second electrode plate 116 is formed on the high dielectric material layer 13 at a position corresponding to each of first electrode plates 11a, so that capacitors 11 are formed by the first electrode plate 11a and the second electrode plate 11b and the high dielectric material layer 13.

The high dielectric material layer 13 in the traditional circuit board structure is made of a material with high dielectric constant. During fabrication of the circuit board structure, the high dielectric material layer 13 is formed on the core layer board 1, the circuit layers 10 and the first electrode plates 11a by lamination. Since the high dielectric material layer 13 contains a higher percentage of ceramic material, it has poor fluidity during the lamination process. As a result, the high dielectric material layer 13 cannot be easily bonded to the surface of the core layer board 1, so delamination may occur between the high dielectric material layer 13 and the core layer board 1.

Furthermore, since the circuit layers 10 and the first electrode plates 11a are protruding from the surface of the core layer board 1, there are step-like height differences between the circuit layer 10 and the core layer board 1 or between the first electrode plates 11a and the core layer board 1, which causes bubbles to form in these step-like height differences during lamination of the high dielectric material layer 13 on the surfaces of the core layer board 1, the circuit layers 10 and the first electrode plates 11a. In consequence, delamination may also occur during subsequent thermal processes, reducing the reliability of the circuit board structure.

Since the circuit layers 10 and the first electrode plates 11a are protruding from the surface of the core layer board 1, the thickness of the high dielectric material layer 13 formed on the core layer board 1, the circuit layers 10 and the first electrode plates 11a is unlikely to be uniform, which results in great variations in the capacitance of the capacitors 11 and therefore reduction in precision thereof.

In order to solve the abovementioned problems, an alternative method for fabricating a circuit board structure with an embedded capacitor is proposed as shown in FIGS. 2A and 2B.

Referring to FIG. 2A, a circuit layer 20 and a first electrode plate 21a are disposed on each of the two opposing surfaces of the core layer board 2. At least one plated through hole (PTH) 22 penetrating the core layer board 2 is formed for electrically connecting the circuit layers 20. A filler layer 23 (e.g. resin material) is formed on the surface of the core layer board 2, wherein the filler layer 23 is flush with the circuit layers 20 and the first electrode plates 21a.

Referring to FIG. 2B, a high dielectric material layer 24 is formed on the surface of the filler layer 23, the circuit layers 20 and the first electrode plates 21a. Second electrode plates 21b are formed on the surface of the high dielectric material layer 24 at positions corresponding to the first electrode plates 21a respectively such that capacitors 21 are formed by the first electrode plate 21a, the second electrode plate 21b, and the high dielectric material layer 23.

In the aforesaid structure, the filler layer 23 is formed on the core layer board 2, so as to render the core layer board 2 uniform, preventing lamination between the high dielectric material layer 24 and the core layer board 2 or formation of bubbles in the high dielectric material layer 24. However, an extra layer (i.e. the filler layer 23) is required in the conventional fabrication process to obtain a uniform surface of the core layer board 2, so the cost of fabrication is increased. In addition, it is difficult to obtain a uniform surface of the core layer board 2 by forming the filler layer 23 on the surface of the core layer board 2. As a result, it is not suitable for fabrication of thin substrates.

Therefore, there is a need for a circuit board structure with an embedded capacitor and a method for fabricating the same that eliminates the shortcomings in the prior art.

SUMMARY OF THE INVENTION

In light of the foregoing drawbacks, an objective of the present invention is to provide a circuit board structure having an embedded capacitor and a method for fabricating the same, so as to maintain the evenness of the surface of a core layer board and therefore prevent lamination between a subsequently formed high dielectric material layer and the core layer board.

Another objective of the present invention is to provide a circuit board structure having an embedded capacitor and a method for fabricating the same, so as to prevent formation of bubbles in the high dielectric material layer and thereby prevent the circuit board structure from cracking during a subsequent process.

Still another objective of the present invention is to provide a circuit board structure having an embedded capacitor and a method for fabricating the same, so as to directly form the high dielectric material layer on the core layer board without disposing any filler material in between the high dielectric material layer and the core layer board, thus streamlining the process and cutting the process cost.

Still another objective of the present invention is to provide a circuit board structure having an embedded capacitor and a method for fabricating the same, so as to form a high dielectric material layer of uniform thickness and thereby embed in the circuit board structure a capacitor of high-precision capacitance, and in consequence application of the prevention invention in fine-pitch circuit fabrication is feasible.

In accordance with the above and other objectives, the present invention provides a circuit board structure having an embedded capacitor and a method for fabricating the same, the circuit board structure comprises: a core layer board with at least one surface having first and second grooves without penetrating the core layer board; a circuit layer and a first electrode plate formed in the first and second grooves of the core layer board respectively and being flush with the core layer board; a high dielectric material layer formed on the core layer board, the circuit layer, and the first electrode plate; and a second electrode plate formed on the high dielectric material layer and corresponding in position to the first electrode plate, so that a capacitor is formed by the first electrode plate, the high dielectric material layer, and the second electrode plate.

The core layer board of the circuit board structure is further formed with a plurality of plated through holes for electrically connecting circuit layers on two surfaces of the core layer board. Formed on the capacitor is a circuit build up structure comprising a plurality of electrically conductive structures for electrically connecting the circuit layer to the second electrode plate of the capacitor.

The circuit build up structure comprises a dielectric layer, the circuit layer stacked on the dielectric layer, and the electrically conductive structures formed in the dielectric layer. A plurality of electrically connecting pads are formed on an outer surface of the circuit build up structure. The outer surface of the circuit build up structure is covered with a solder mask. A plurality of openings are formed in the solder mask to expose the electrically connecting pads on the outer surface of the circuit build up structure.

Given the above structure, the present invention discloses a method for fabricating a circuit board structure having an embedded capacitor, comprising the steps of: providing a core layer board, forming on at least one surface of the core layer board first and second grooves without penetrating the core layer board; forming a circuit layer and a first electrode plate in the first and second grooves of the core layer board respectively, wherein the circuit layer and first electrode plate are flush with the core layer board; forming a high dielectric material layer on the core layer board, the circuit layer, and the first electrode plate; and forming a second electrode plate on the high dielectric material layer and corresponding in position to the first electrode plate, so that a capacitor is formed by the second electrode plate, the high dielectric material layer, and the first electrode plate.

The circuit layer and the first electrode plate are formed by the steps of: forming an electrically conductive layer on the core layer board and in the first and second grooves; forming a resist on the electrically conductive layer, forming a plurality of openings in the resist to expose the electrically conductive layer in the first and second grooves of the core layer board; forming the circuit layer and the first electrode plate on the electrically conductive layer in the first and second grooves of the core layer board respectively by electroplating, wherein the core layer board is flush with the circuit layer and the first electrode plate; and removing the resist and the electrically conductive layer covered therewith.

The core layer board of the circuit board structure is further formed with a plurality of plated through holes for electrically connecting circuit layers on two surfaces of the core layer board. Formed on the capacitor is a circuit build up structure comprising a plurality of electrically conductive structures for electrically connecting the circuit layer to the second electrode plate of the capacitor.

Another embodiment of the aforesaid fabrication method comprises the step of forming at least one plated through hole (PTH) penetrating the grooves of the core layer board for electrical connection of the circuit layers on the two surfaces of the core layer board, wherein the PTH is flush with the core layer board; and forming on the capacitor a circuit build up structure comprising a plurality of electrically conductive structures for electrically connecting the circuit layer to the second electrode plate of the capacitor.

The circuit build up structure comprises a dielectric layer, the circuit layer stacked on the dielectric layer, and the electrically conductive structures formed in the dielectric layer. A plurality of electrically connecting pads are formed on an outer surface of the circuit build up structure. The outer surface of the circuit build up structure is covered with a solder mask. A plurality of openings are formed in the solder mask to expose the electrically connecting pads on the outer surface of the circuit build up structure.

The present invention provides a circuit board structure having an embedded capacitor and a method for fabricating the same. The circuit board structure includes a core layer board with at least one surface having non-penetrating first and second grooves, a circuit layer and a first electrode plate formed in the first and second grooves of the core layer board respectively and being flush with the core layer board, such that a high dielectric material layer of uniform thickness can be formed on the core layer board. As a result, a capacitor of high-precision capacitance can be formed, eliminating drawbacks of the prior art, such as delamination between the high dielectric material layer and the circuit layer-equipped core layer board and formation of bubbles in the high dielectric material layer, and enhancing reliability of the circuit board structure.

In addition, the present invention discloses directly forming a high dielectric material layer on an insulating board without disposing any filler material in between the core layer board and the high dielectric material layer, so as to planarize the surface of the core layer board, thus streamlining the process, cutting the process cost, and enabling application in fine-pitch circuit fabrication.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Referring to FIGS. 3A-1, 3A-2 and 3A-3, a core layer board is provided. The core layer board is an insulating board 3a, a composite board 3b made of a plurality of different material layers (e.g. a plurality of dielectric layers made of different materials) or a circuit board 3c with at least one circuit layer. The following embodiments are described using the insulating board as an example for the sake of conciseness.

Referring to FIGS. 4A to 4H, a first embodiment of a method for fabricating a circuit board structure with an embedded capacitor of the present invention is described.

Figure 1A:
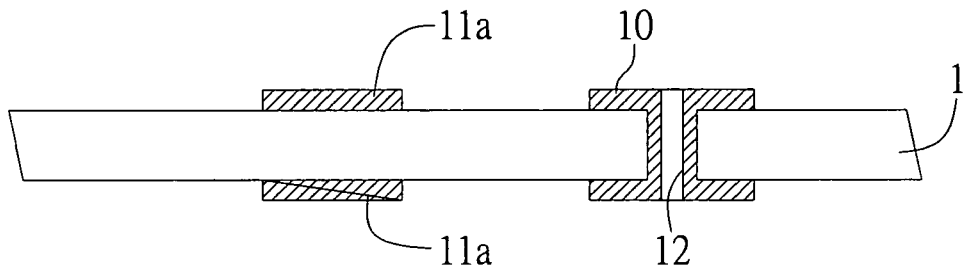
FIGS. 1A to 1C (PRIOR ART) are cross-sectional views illustrating a conventional method for fabricating a circuit board structure with an embedded capacitor.
Figure 1B:
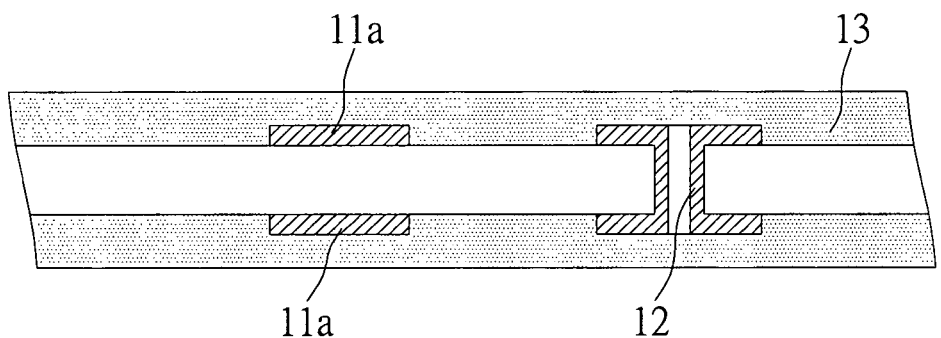
Figure 1C:
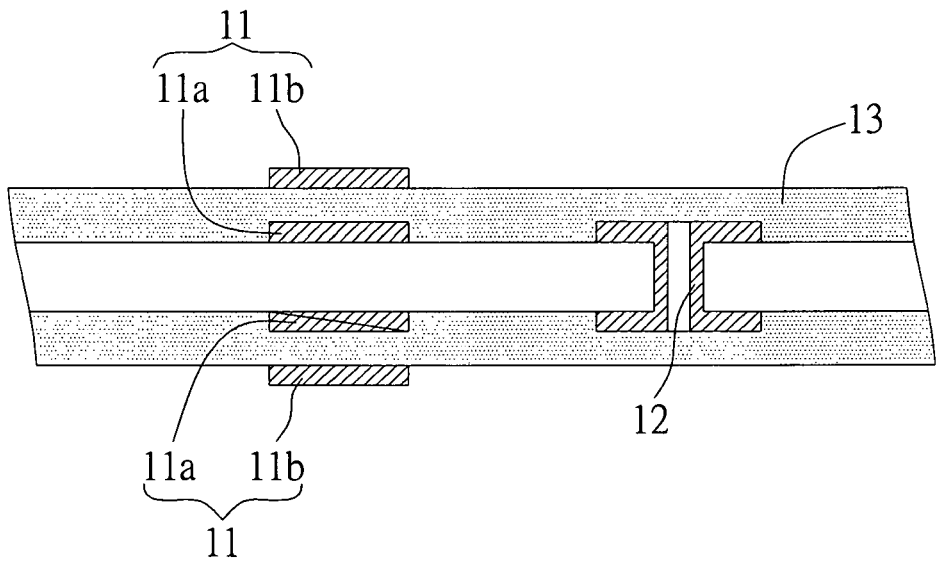
Figure 2A:
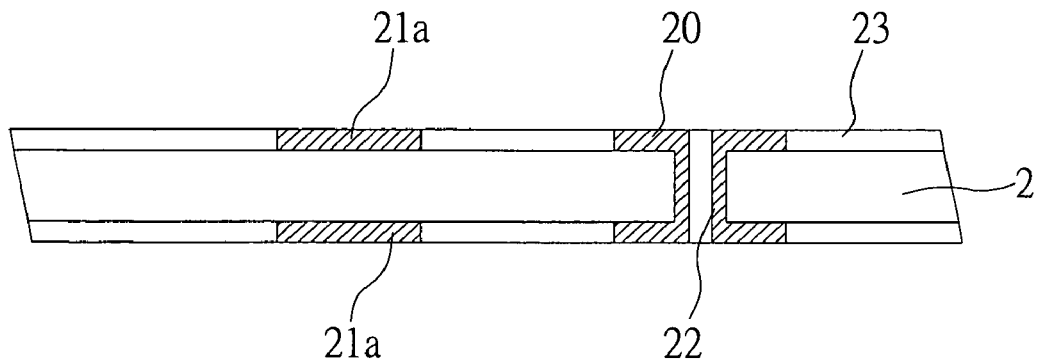
FIGS. 2A and 2B (PRIOR ART) are cross-sectional views illustrating another conventional method for fabricating a circuit board structure with an embedded capacitor.
Figure 2B:
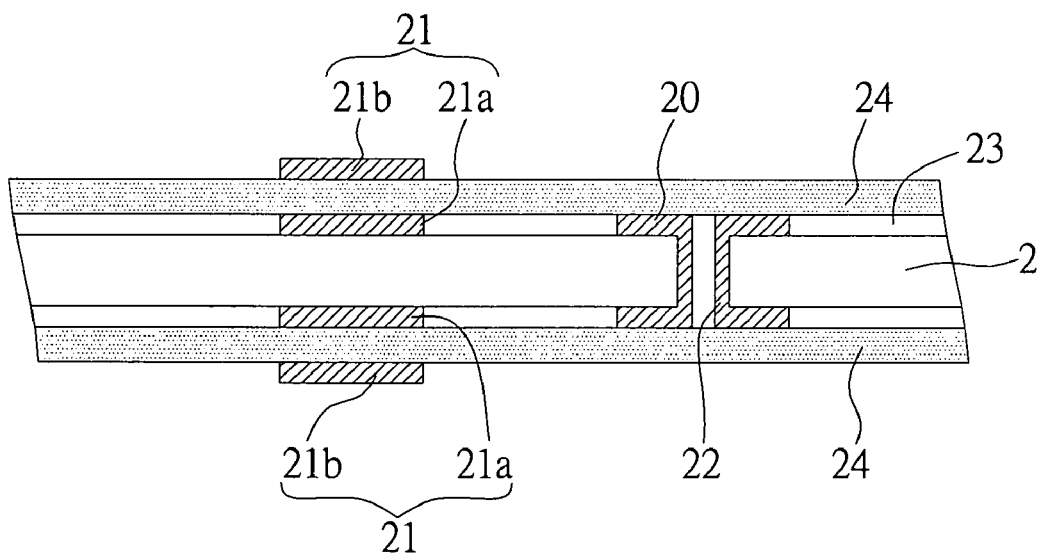
Figures 1, 3A:
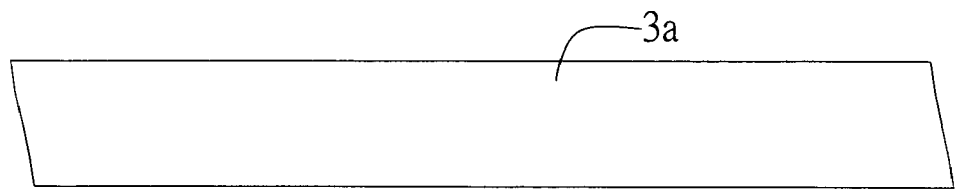
FIGS. 3A-1, 3A-2 and 3A-3 are cross-sectional views showing a core layer board of a method for fabricating a circuit board structure with an embedded capacitor in accordance with the present invention.
Figures 2, 3A:
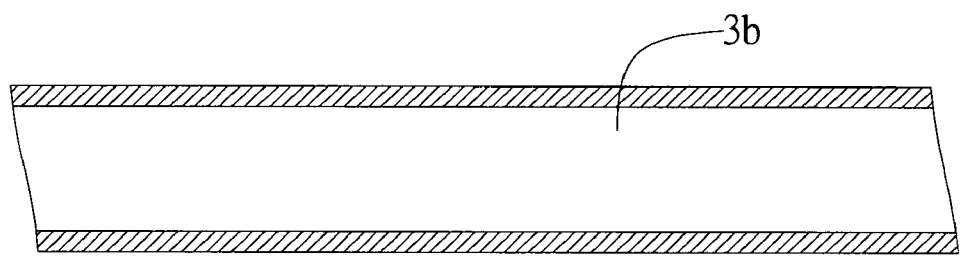
Figures 3, 3A:
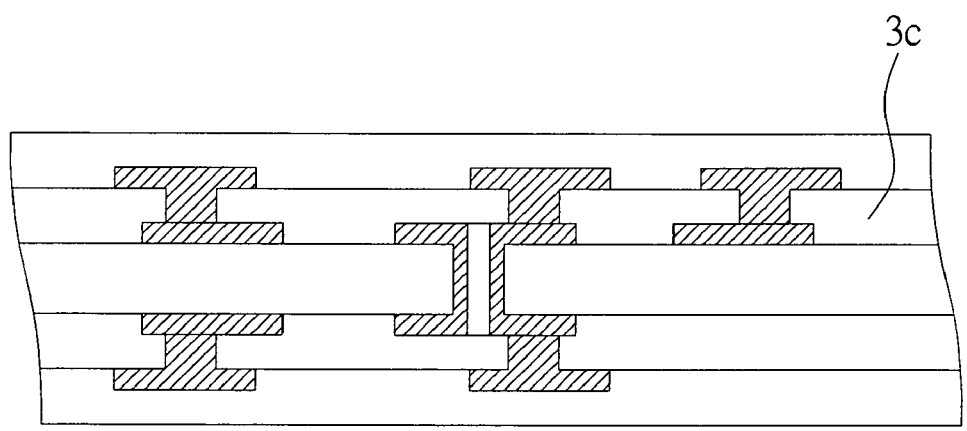
Figure 4A:
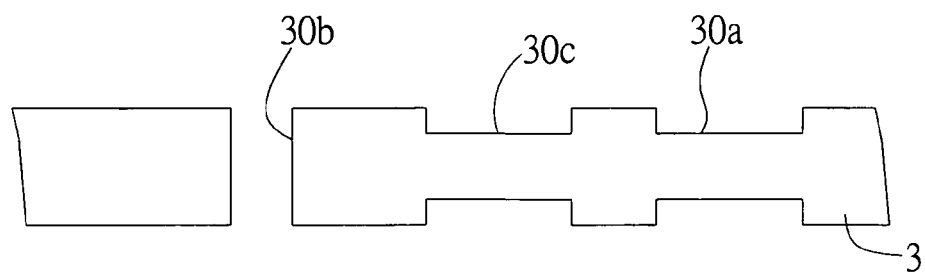
FIGS. 4A to 4H are cross-sectional views illustrating a first embodiment of a method for fabricating a circuit board structure with an embedded capacitor in accordance with the present invention.

Referring to FIG. 4A, a core layer board 3 is provided, where non-penetrating first and second grooves 30a, 30C are formed on at least one surface of the core layer board 3. The first and second grooves 30a, 30c can be formed by laser stripping, plasma etching, or photolithography. The embodiment is exemplified by non-penetrating first and second grooves 30a, 30c on two surfaces of a core layer board and at least one groove 30b penetrating the core layer board.

Figure 4B:
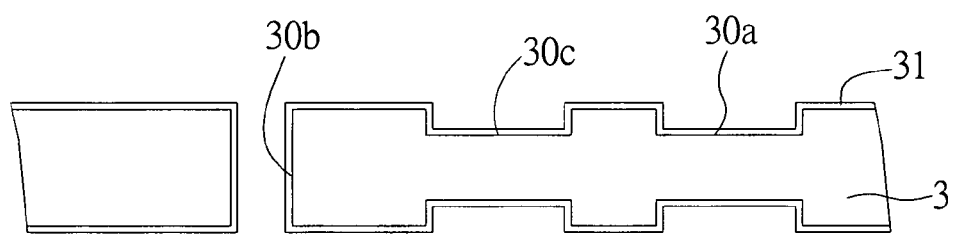

Referring to FIG. 4B, an electrically conductive layer 31 is then formed on the surfaces of the core layer board 37 the first and second grooves 30a, 30c and the groove 30b. The electrically conductive layer 31 is used as an electrical conduction path for an electroplating process, and can be made of metal, alloy or several metal layers deposited together. It can be made of, for example, at least one selected from the group consisting of copper, tin, nickel, chromium, titanium, copper-chromium alloy, and tin-lead alloy. It can also be made of a conductive polymer, for example, polyethylene, polyaniline, or organosulfur polymer.

Figure 4C:
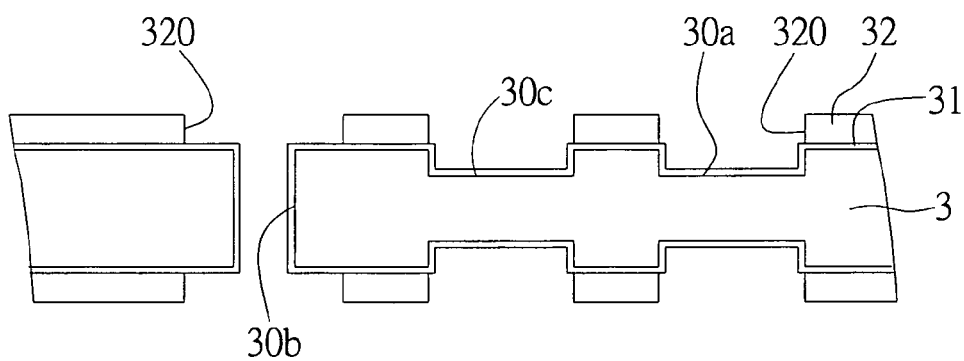

Referring to FIG. 4C, a resist 32 is formed on the core layer board 3, such that the resist 32 covers the electrically conductive layer 31 on the core layer board 3. The resist 32 may be a dry or liquid photoresist formed on the electrically conductive layer 31 by printing, spin coating or adhesive bonding. The resist 32 is then patterned by exposure and development to form a plurality of openings 320 that expose the first and second grooves 30a, 30c and the groove 30b of the core layer board 3.

Figure 4D:
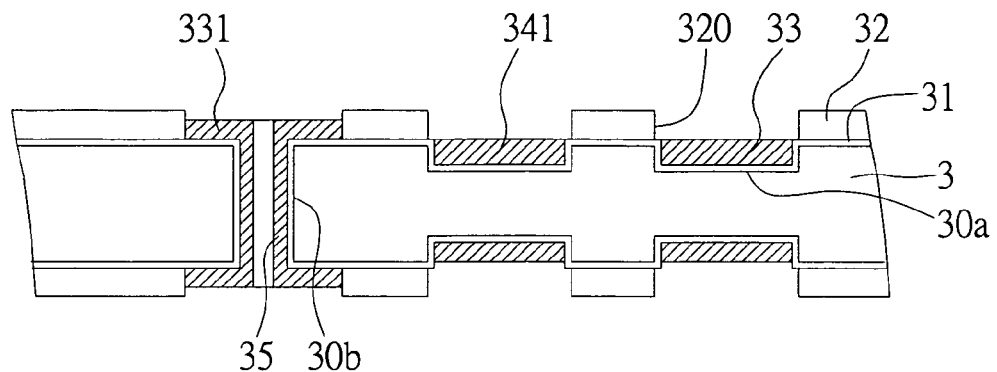

Referring to FIG. 4D, an electroplating process is performed on the core layer board 3, wherein the electrically conductive layer 31 exhibits electrical conductivity and thereby acts as an electrical conduction path for the electroplating process. Accordingly, circuit layers 33, contact pads 331 and first electrode plates 341 are electroplated to the electrically conductive layer 31 exposed through the openings 320 of the resist 32, and a plated through hole (PTH) 35 penetrating the core layer board 3 is formed in the groove 30b. The contact pads 331 are disposed at both ends of the plated through hole 35 to electrically connect the circuit layers 33 on the two surfaces of the core layer board 3. The circuit layers 33, the first electrode plates 341 and the contact pads 331 can be made of a metal, such as lead, tin, silver, copper, gold, bismuth, antimony, zinc, nickel, zirconium, magnesium, indium, and tellurium. However, in practice, since copper is fit for electroplating and cheap to use, the circuit layers 33, the first electrode plates 341 and the contact pads 331 are preferably made of copper, but the present invention is not limited to the above-mentioned.

Figure 4E:
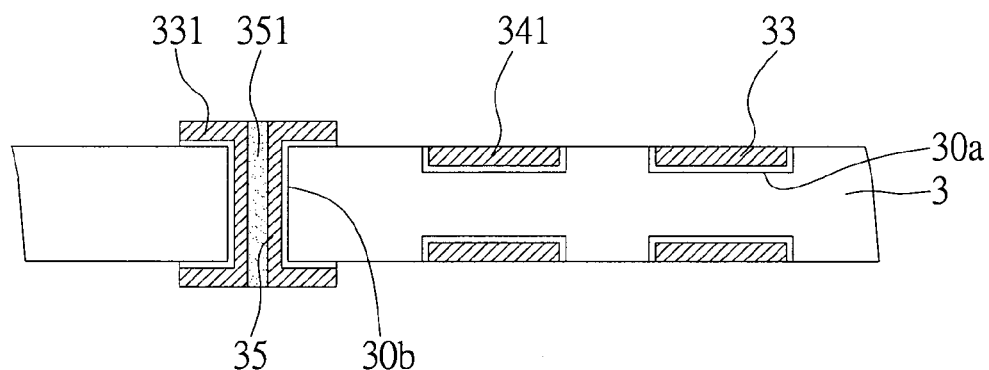

Referring to FIG. 4E, the resist 32 and the underlying electrically conductive layer 31 are removed, wherein the removal process is a well-known process in the related art and therefore is not herein detailed. Then, the plated through hole 35 is filled with an electrically conductive or non-conductive filler material 351. Thereafter, planarization is performed to render the circuit layers 33 and the first electrode plates 341 flush with the core layer board 3, and render the contact pads 331 higher than the core layer board 3.

The present invention involves forming in the core layer board non-penetrating first and second grooves for subsequent formation of circuit layers and first electrode plates therein, and allowing the circuit layers and the first electrode plates to be flush with the core layer board such that the core layer board has a flat, even surface. As a result, a high dielectric material layer of uniform thickness can be formed on the circuit layers, the first electrode plates, and the core layer board, thereby eliminating drawbacks of the prior art, such as delamination between the core layer board and the high dielectric material layer, formation of bubbles in the high dielectric material layer, and uneven thickness of the high dielectric material layer.

Figure 4F:
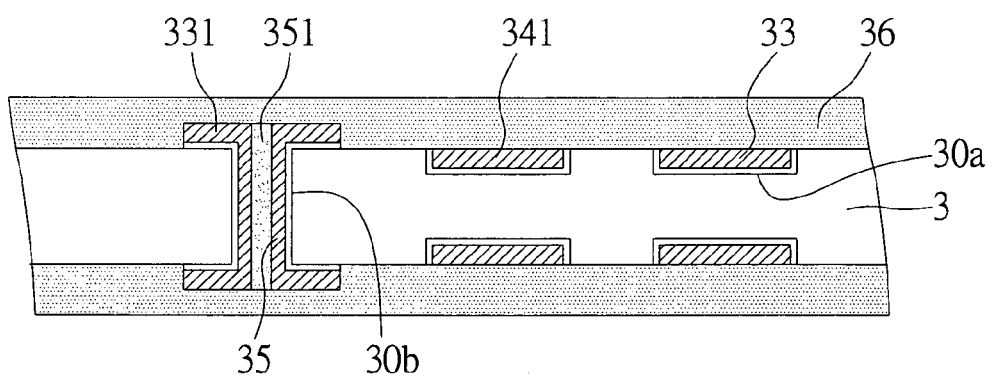

Referring to FIG. 4F, a high dielectric material layer 36 is formed on the core layer board 3, the circuit layer 33, the contact pad 331, the first dielectric plate 341 and the plated through hole 35.

Figure 4G:
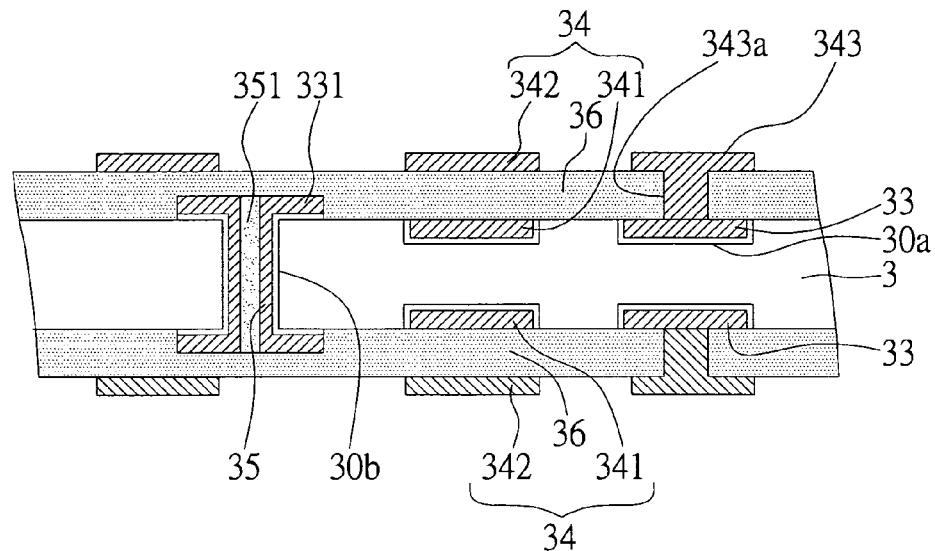

Referring to FIG. 4G, a second electrode plate 342 is formed on the high dielectric material layer at a position corresponding to the first electrode plate 341, such that a capacitor 34 is formed by the first electrode plate 341, the high dielectric material layer 36, and the second electrode plate 342. In addition, further circuit layers 343 can be formed on the surface of the high dielectric material layer 36 during formation of the second electrode plates 342. The circuit layers 343 can be electrically connected to the circuit layers 33 in the core layer board 3 through an electrically conductive structure 343a (e.g. electrically conductive blind via) in the high dielectric material layer 36.

Figure 4H:
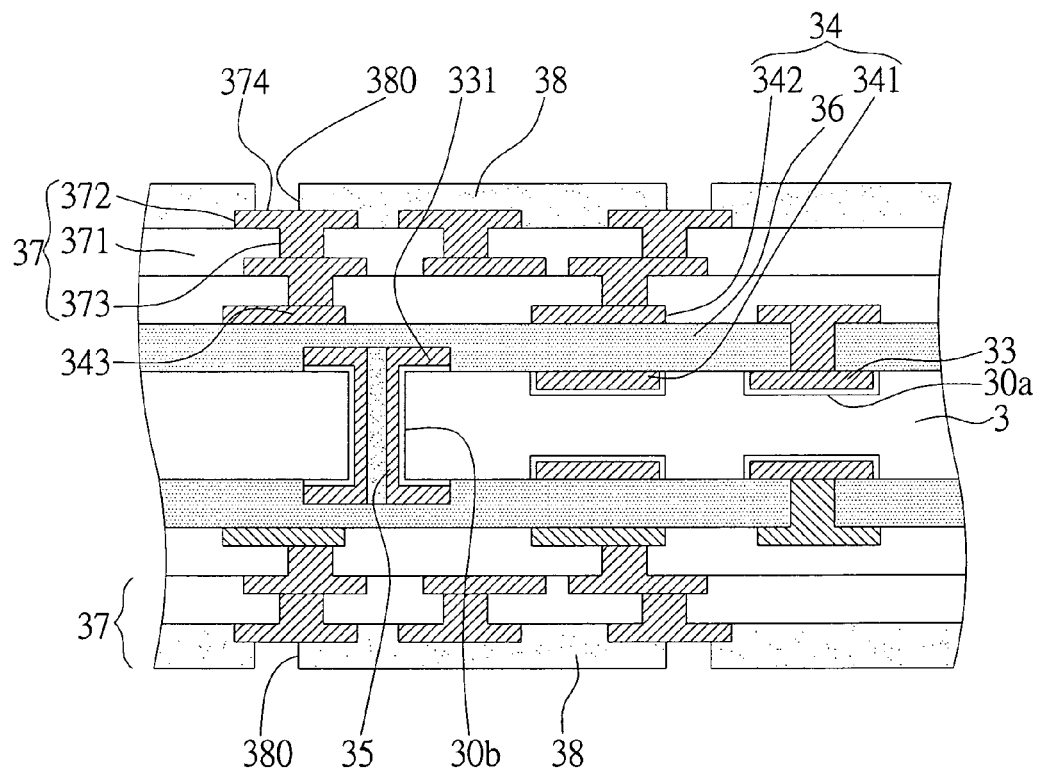

As shown in FIG. 4H, a circuit build up structure 37 can be further formed on the high dielectric material layer 36, the second electrode plate 342 and the circuit layer 343. The circuit build up structure 37 comprises a dielectric layer 371, a circuit layer 372 on the dielectric layer 371, and electrically conductive structures 373 in the dielectric layer 371. The electrically conductive structures 373 are electrically connected to the circuit layer 343 and the second electrode plate 342 of the capacitor 34. A plurality of electrically connecting pads 374 are formed on the outer surface of the circuit build up structure 37. Further, the outer surface of the circuit build up structure 37 is covered with a solder mask 38. A plurality of openings 380 are formed in the solder mask 38 to expose the electrically connecting pads 374 of the circuit build up structure 37.

FIGS. 5A to 5E are cross-sectional diagrams showing a second embodiment of the method for fabricating a circuit board structure with an embedded capacitor of the present invention. The difference between the second and the first embodiments is that the second embodiment has contact pads that are flush with the core layer board to facilitate formation of the high dielectric material layer.

Figure 5A:
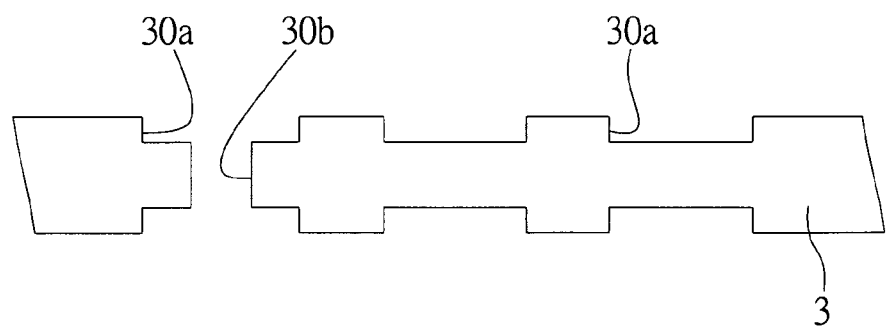
FIGS. 5A to 5E are cross-sectional views illustrating a second embodiment of a method for fabricating a circuit board structure with an embedded capacitor in accordance with the present invention.

Referring to FIG. 5A, a core layer board 3 is provided, where non-penetrating first and second grooves 30a, 30c are formed on two surfaces of the core layer board 3 and at least one groove 30b penetrating the core layer board 3 is formed.

Figure 5B:
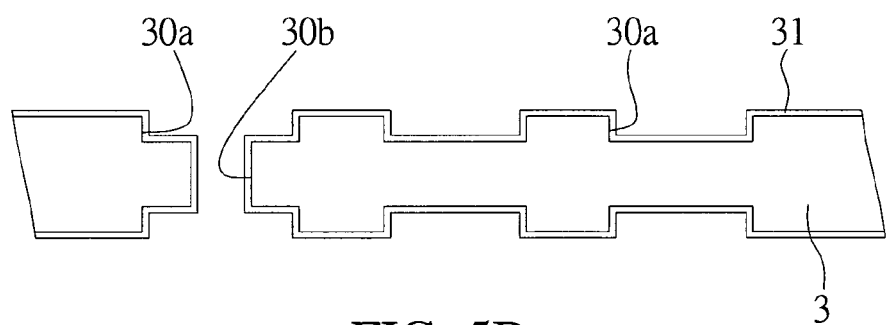

Referring to FIG. 5B, an electrically conductive layer 31 is then formed on the surfaces of the core layer board 3, the first and second grooves 30a, 30c and the groove 30b.

Figure 5C:
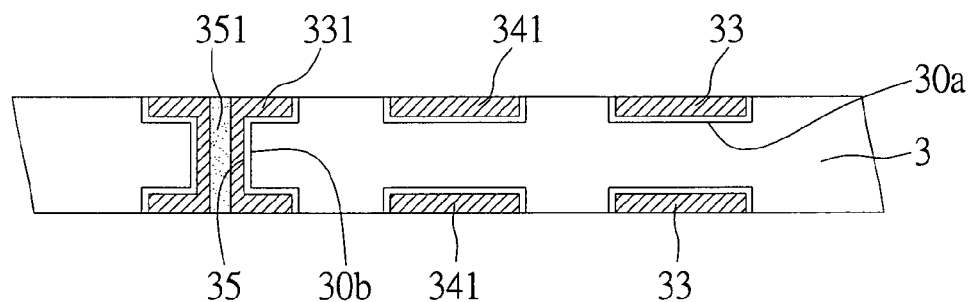

Referring to FIG. 5C, a metal layer (not shown) is formed on the electrically conductive layer 31. The metal layer is then planarized to remove portions of the metal layer protruding out of the surface of core layer board. Circuit layers 33, contact pads 331 and first electrode plates 341 are thus formed in the first and second grooves 30a, and the plated through hole 35 is formed in the groove 30b, such that the circuit layers 33, the contact pads 331 in the plated through hole 35, and the first electrode plates 341 are flush with the core layer board 3. Alternatively, a resist (not shown) is formed on the surface of the electrically conductive layer 31. The resist is formed with openings for exposing the electrically conductive layer 31 in the first and second grooves 30a, 30c and the groove 30b. Then, a metal layer (not shown) is formed on the surface of the electrically conductive layer 31 in the first and second grooves 30a and the groove 30b by electroplating. The resist and the underlying electrically conductive layer 31 are removed. Afterward, planarization is performed, to form the circuit layers 33, contact pads 331 and first electrode plates 341 in the first and second grooves 30a, 30c and the plated through hole 35 in the groove 30b, such that the circuit layers 33, the contact pads 331, the first electrode plates 341 and the plated through hole 35 are flush with the core layer board 3. Then, the plated through hole 35 is filled with an electrically conductive or non-conductive filler material 351. The filler material can be omitted when employing the approach of forming the metal layer as described above.

Figure 5D:
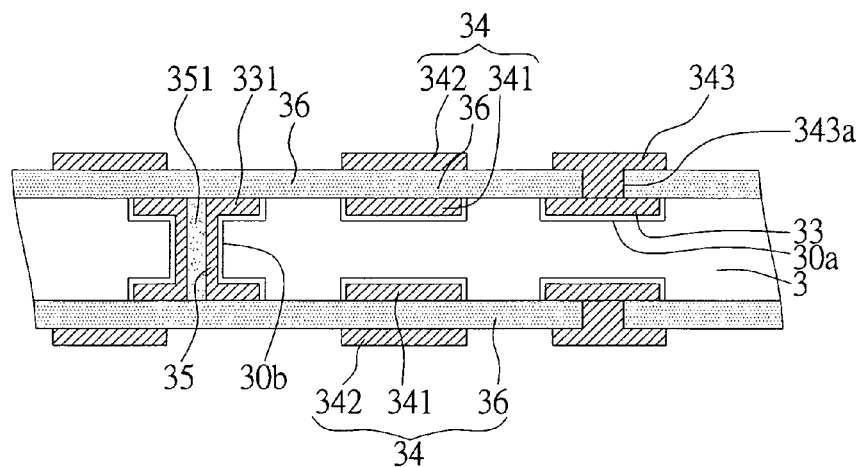

Referring to FIG. 5D, the high dielectric material layer 36 is formed on the core layer board 3, the circuit layers 33, the first electrode plates 341, and the contact pads 331 of the plated through hole 35, and then the second electrode plate 342 corresponding in position to the first electrode plates 341 is formed on the high dielectric material layer 36 such that the capacitor 34 is formed by the first electrode plates 341, high dielectric material layer 36, and second electrode plate 342. In addition, further circuit layers 343 can be formed on the surface of the high dielectric material layer 36. The circuit layers 343 are electrically connected to the circuit layers 33 in the core layer board 3 through an electrically conductive structure 343a.

Figure 5E:
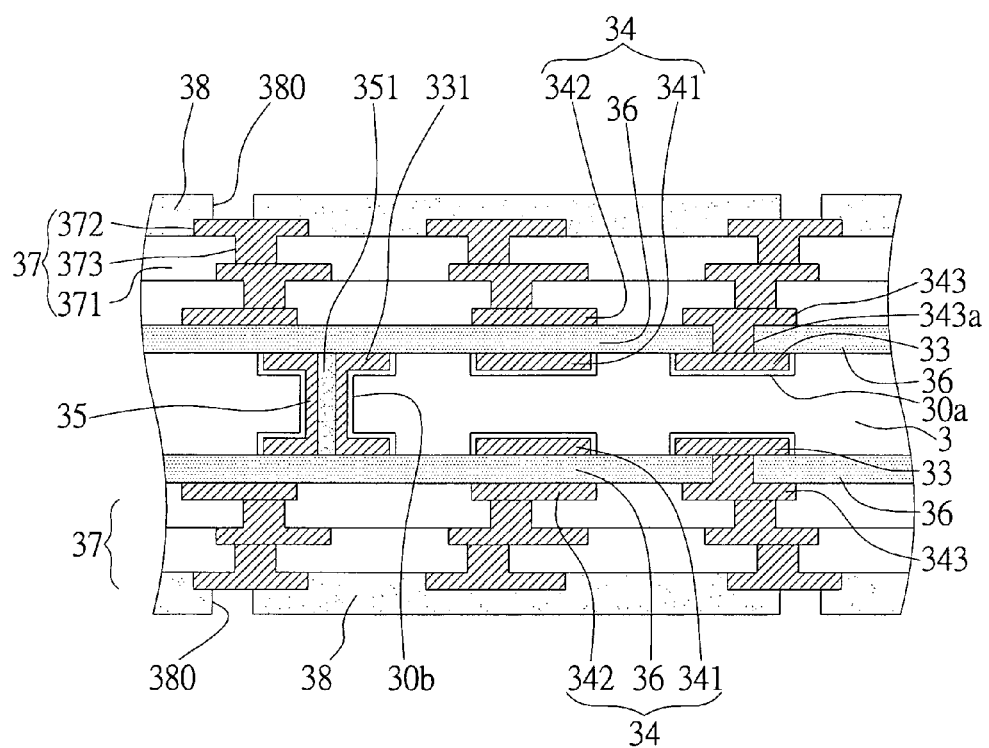

Referring to FIG. 5E, the circuit build up structure 37 is formed on the high dielectric material layer 36, the second electrode plate 342 and the circuit layer 343. The circuit build up structure 37 comprises the dielectric layer 371, the circuit layer 372 on the dielectric layer 371, and the electrically conductive structures 373 in the dielectric layer 371. The electrically conductive structures 373 are electrically connected to the circuit layer 343 and the second electrode plate 342 of the capacitor 34. The plurality of electrically connecting pads 374 are formed on the outer surface of the circuit build up structure 37. Further, the outer surface of the circuit build up structure 37 is covered with the solder mask 38. The plurality of openings 380 are formed in the solder mask 38 to expose the electrically connecting pads 374 on the outer surface of the circuit build up structure 37.

According to the first embodiment and second embodiment of the fabrication method, the present invention provides a circuit board structure having an embedded capacitor. The circuit board structure comprises: a core layer board 3 with two surfaces having first and second grooves 30a, 30c without penetrating the core layer board 3; a circuit layer 33 and a first electrode plate 341 formed in the first and second grooves 30a, 30c of the core layer board 3 respectively and being flush with the core layer board 3; a high dielectric material layer 36 formed on the core layer board 3, the circuit layer 33 and the first electrode plate 341; a second electrode plate 342 formed on the high dielectric material layer 36 and corresponding to the first electrode plate 341, thereby forming a capacitor 34 by the first and second electrode plates 341, 342 and the high dielectric material layer 36. Further, the circuit layer 343 is formed above the capacitor 34 and electrically connected to the circuit layer 33 via the electrically conductive structure 343a.

Given the above structure, the core layer board 3 further comprises at least one plated through hole 35 for electrically connecting the circuit layers 33 on the two surfaces of the core layer board 3. The plated through hole 35 is either higher than or flush with the core layer board 3. The circuit build up structure 37 is formed on the high dielectric material layer 36, the circuit layer 343, and the second electrode plate 342 of the capacitor 34. The circuit build up structure 37 comprises the dielectric layer 371, the circuit layer 372 on the dielectric layer 371, and the electrically conductive structures 373 in the dielectric layer 371. The electrically conductive structures 373 are electrically connected to the circuit layer 343 and the second electrode plate 342 of the capacitor 34. The plurality of electrically connecting pads 374 are formed on the outer surface of the circuit build up structure 37. Further, the outer surface of the circuit build up structure 37 is covered with the solder mask 38. The plurality of openings 380 are formed in the solder mask 38 to expose the electrically connecting pads 374 on the outer surface of the circuit build up structure 37

Accordingly, the present invention provides a circuit board structure having an embedded capacitor and a method for fabricating the same. The circuit board structure comprises a core layer board with at least one surface having non-penetrating first and second grooves, a circuit layer and a first electrode plate formed in the first and second grooves of the core layer board respectively and being flush with the core layer board; and a high dielectric material layer formed on the core layer board and characterized by uniform thickness. The present invention provides a circuit board structure having an embedded capacitor and a method for fabricating the same with a view to providing a capacitor of high-precision capacitance, eliminating drawbacks of the prior art, such as delamination between the high dielectric material layer and the circuit layer-equipped core layer board and formation of bubbles in the high dielectric material layer, and enhancing reliability of the circuit board structure.

In addition, the present invention discloses directly forming a high dielectric material layer on an insulating board without disposing any filler material in between the core layer board and the high dielectric material layer, so as to planarize the surface of the core layer board, thus streamlining the process, cutting the process cost, and enabling application in fine-pitch circuit fabrication.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:

1. A circuit board structure having an embedded capacitor, comprising:
   a core layer board with at least one surface having first and second grooves without penetrating the core layer board;

a circuit layer formed in the first groove of the core layer board and being flush with the core layer board;

a first electrode plate formed in the second groove of the core layer board and being flush with the core layer board;

a high dielectric material layer formed on the core layer board, the circuit layer, and the first electrode plate; and a second electrode plate formed on the high dielectric material layer and corresponding in position to the first electrode plate, so that a capacitor is formed by the first electrode plate, the high dielectric material layer, and the second electrode plate.

2. The circuit board structure having an embedded capacitor of claim 1, further comprising a plated through hole (PTH) penetrating the core layer board for electrical connection of the circuit layers on the two surfaces of the core layer board, wherein the PTH protrudes from the core layer board.

3. The circuit board structure having an embedded capacitor of claim 1, further comprising a plated through hole (PTH) penetrating the grooves of the core layer board for electrical connection of the circuit layers on the two surfaces of the core layer board, wherein the PTH is flush with the core layer board.

4. The circuit board structure having an embedded capacitor of claim 2 or 3, further comprising a circuit build up structure formed on the capacitor and formed with a plurality of electrically conductive structures for electrically connecting the circuit layer to the second electrode plate of the capacitor.

5. The circuit board structure having an embedded capacitor of claim 4, wherein a plurality of electrically connecting pads are formed on an outer surface of the circuit build up structure.

6. The circuit board structure having an embedded capacitor of claim 4, wherein the circuit build up structure comprises a dielectric layer, the circuit layer stacked on the dielectric layer, and the electrically conductive structures formed in the dielectric layer.

7. The circuit board structure having an embedded capacitor of claim 5, further comprising a solder mask covering the outer surface of the circuit build up structure, wherein a plurality of openings are formed in the solder mask to expose the electrically connecting pads on the outer surface of the circuit build up structure.

8. A method for fabricating a circuit board structure having an embedded capacitor, comprising the steps of:

providing a core layer board, forming on at least one surface of the core layer board first and second grooves without penetrating the core layer board;

forming a circuit layer and a first electrode plate in the first and second grooves of the core layer board respectively, wherein the circuit layer and first electrode plate are flush with the core layer board;

forming a high dielectric material layer on the core layer board, the circuit layer, and the first electrode plate; and forming a second electrode plate on the high dielectric material layer and corresponding in position to the first electrode plate, so that a capacitor is formed by the second electrode plate, the high dielectric material layer, and the first electrode plate.

9. The method for fabricating a circuit board structure having an embedded capacitor of claim 8, further comprising the step of forming at least one plated through hole (PTH) penetrating the core layer board for electrical connection of the circuit layers on the two surfaces of the core layer board, wherein the PTH protrudes from the core layer board.

10. The method for fabricating a circuit board structure having an embedded capacitor of claim 8, further comprising the step of forming at least one plated through hole (PTH) penetrating the grooves of the core layer board for electrical connection of the circuit layers on the two surfaces of the core layer board, wherein the PTH is flush with the core layer board.

11. The method for fabricating a circuit board structure having an embedded capacitor of claim 8, wherein the circuit layer and the first electrode plate are formed by the steps of:

forming an electrically conductive layer on the core layer board and in the first and second grooves;

forming a resist on the electrically conductive layer, forming a plurality of openings in the resist to expose the electrically conductive layer in the first and second grooves of the core layer board; and forming the circuit layer and the first electrode plate on the electrically conductive layer in the first and second grooves of the core layer board respectively by electroplating, wherein the core layer board is flush with the circuit layer and the first electrode plate.

12. The method for fabricating a circuit board structure having an embedded capacitor of claim 8, wherein the first and second grooves not penetrating the core layer board are formed by one selected from the group consisting of laser stripping, plasma etching, and patterning-exposure-development.

13. The method for fabricating a circuit board structure having an embedded capacitor of claim 9 or 10, further comprising the step of forming on the capacitor a circuit build up structure including a plurality of electrically conductive structures for electrically connecting the circuit layer to the second electrode plate of the capacitor.

14. The method for fabricating a circuit board structure having an embedded capacitor of claim 11, further comprising the step of removing the resist and the electrically conductive layer covered therewith.

15. The method for fabricating a circuit board structure having an embedded capacitor of claim 13, further comprising the step of forming a plurality of electrically connecting pads on an outer surface of the circuit build up structure.

16. The method for fabricating a circuit board structure having an embedded capacitor of claim 15, further comprising the step of covering the outer surface of the circuit build up structure with a solder mask, wherein a plurality of openings are formed in the solder mask to expose the electrically connecting pads on the outer surface of the circuit build up structure.

* * * * *